United States Patent
Wu

(10) Patent No.: US 8,373,260 B1
(45) Date of Patent: Feb. 12, 2013

(54) CHIP PACKAGE

(75) Inventor: Kai-Wen Wu, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/334,106

(22) Filed: Dec. 22, 2011

(30) Foreign Application Priority Data

Sep. 9, 2011 (TW) .................................. 100132757

(51) Int. Cl.
*H01L 23/20* (2006.01)
(52) U.S. Cl. ........................................................ 257/678
(58) Field of Classification Search .................... 257/13, 257/79–103, 918, E51.018–E51.022, E33.001–E33.077, 257/E33.054, E25.028, E25.032, E31.058, 257/E31.063, E31.115, E27.133–E27.139, 257/458, 656, E33.046, E29.336, E31.036, 257/E31.087–E31.088, E31.061–E31.062, 257/252–254, 257–258, 678–733, 787–796, 257/E23.001–E23.194, E23.181, E21.502; 438/22, 24, 48, 15, 26, 51, 55, 64, 106, 124–127
See application file for complete search history.

(56) References Cited

U.S. PATENT DOCUMENTS

| | | | | |
|---|---|---|---|---|
| 7,049,696 | B2 * | 5/2006 | Kubo | 257/706 |
| 7,683,475 | B2 * | 3/2010 | Lee et al. | 257/723 |
| 7,851,811 | B2 * | 12/2010 | Dutta | 257/84 |
| 2007/0023887 | A1 * | 2/2007 | Matsui | 257/686 |
| 2008/0213933 | A1 * | 9/2008 | Fisher et al. | 438/48 |
| 2009/0251862 | A1 * | 10/2009 | Knickerbocker et al. | 361/699 |
| 2010/0301373 | A1 * | 12/2010 | Urano et al. | 257/98 |
| 2011/0180913 | A1 * | 7/2011 | Liou et al. | 257/666 |
| 2011/0273076 | A1 * | 11/2011 | Liang et al. | 313/318.01 |
| 2012/0061702 | A1 * | 3/2012 | Andrews et al. | 257/98 |
| 2012/0068208 | A1 * | 3/2012 | Tseng et al. | 257/98 |
| 2012/0080688 | A1 * | 4/2012 | Raffetto et al. | 257/76 |

* cited by examiner

*Primary Examiner* — Dao H Nguyen
*Assistant Examiner* — Tram H Nguyen
(74) *Attorney, Agent, or Firm* — Altis Law Group, Inc.

(57) ABSTRACT

A chip package includes a circuit board, a pad, a chip, and an adhesive layer. The circuit board includes a substrate and a circuit layer formed on the substrate. The pad includes an electrical connection area in a center portion thereof and an extending area extending outward from the electrical connection area. The electrical connection area covers the circuit layer. The extending area surrounds the electrical connection area and the circuit layer. The chip includes two chip areas and an enlarging area. The two chip areas are separated from each other and electrically connected to the electrical connection area. The enlarging area surrounds the two chip areas. The adhesive layer attaches the chip to the pad. The chip and the pad are positioned on opposite sides of the adhesive layer.

13 Claims, 4 Drawing Sheets

CHIP PACKAGE

BACKGROUND

1. Technical Field

The present disclosure relates to a chip package.

2. Description of Related Art

In miniaturizing electronic apparatuses, more than one chip is put into a package in order to achieve a high density of the package. Thus, the chips are getting smaller. Generally, the chips are attached onto a pad on a printed circuit board with glue. During packaging of the chips, it is difficult to control the amount of the glue applied as the size of the chips becomes smaller. If insufficient glue is used, the chip may not properly adhere to the pad and may easily be detached, which may cause complete failure of the chip package. On the other hand, if excessive glue is used, the glue may overflow to other places and negatively influence other elements. In addition, as the glue flows, it may shift the chips from their original locations before the glue solidifies.

Therefore, it is desirable to provide a chip package, which can overcome or at least alleviate the limitations described.

DETAILED DESCRIPTION

Figure 1:
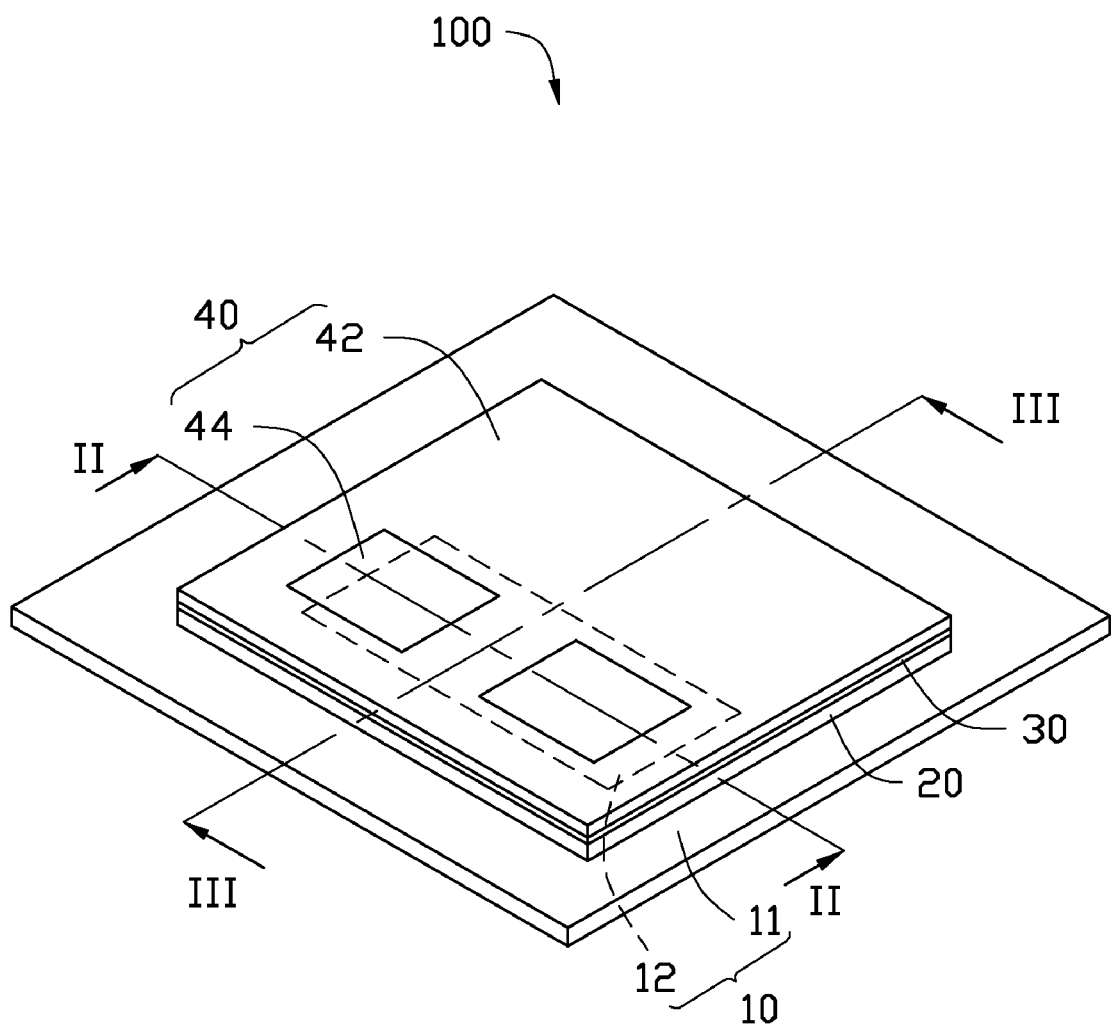
FIG. 1 is an isometric view of a chip package, according to a first exemplary embodiment.
Figure 2:
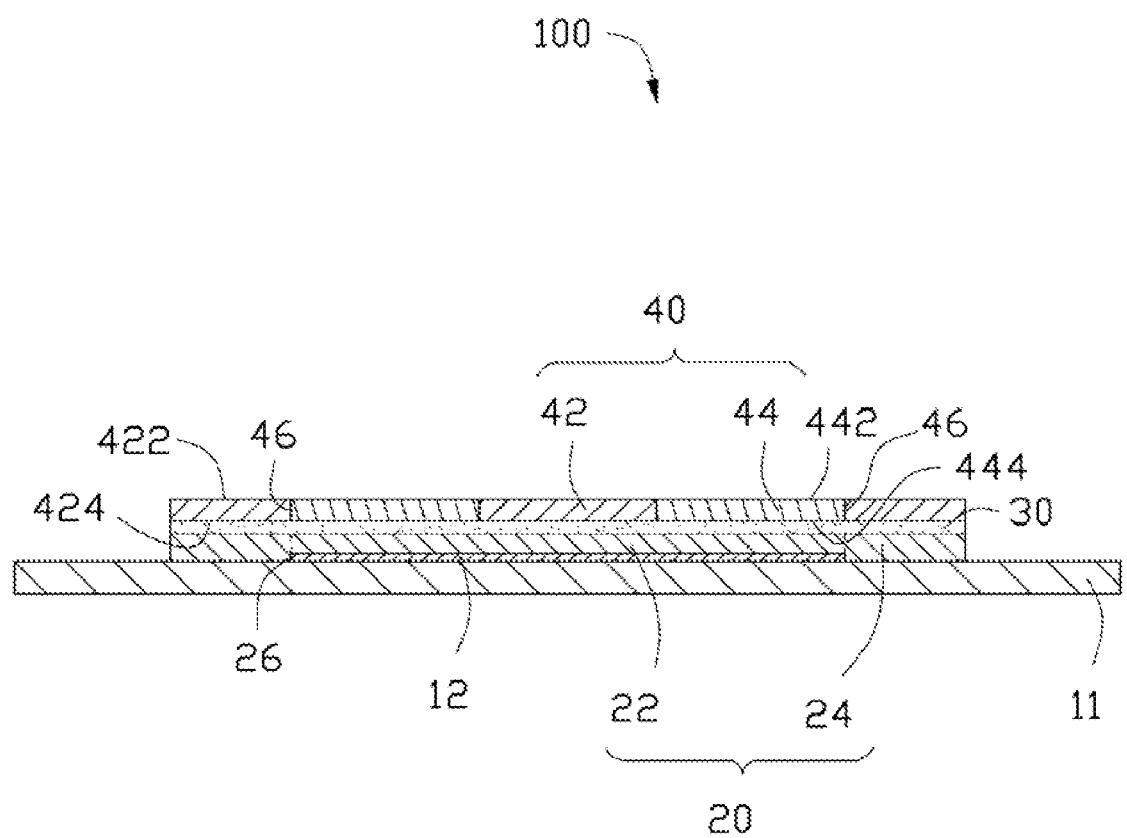
FIG. 2 is a sectional view of the chip package of FIG. 1, taken along line II-II thereof.
Figure 3:
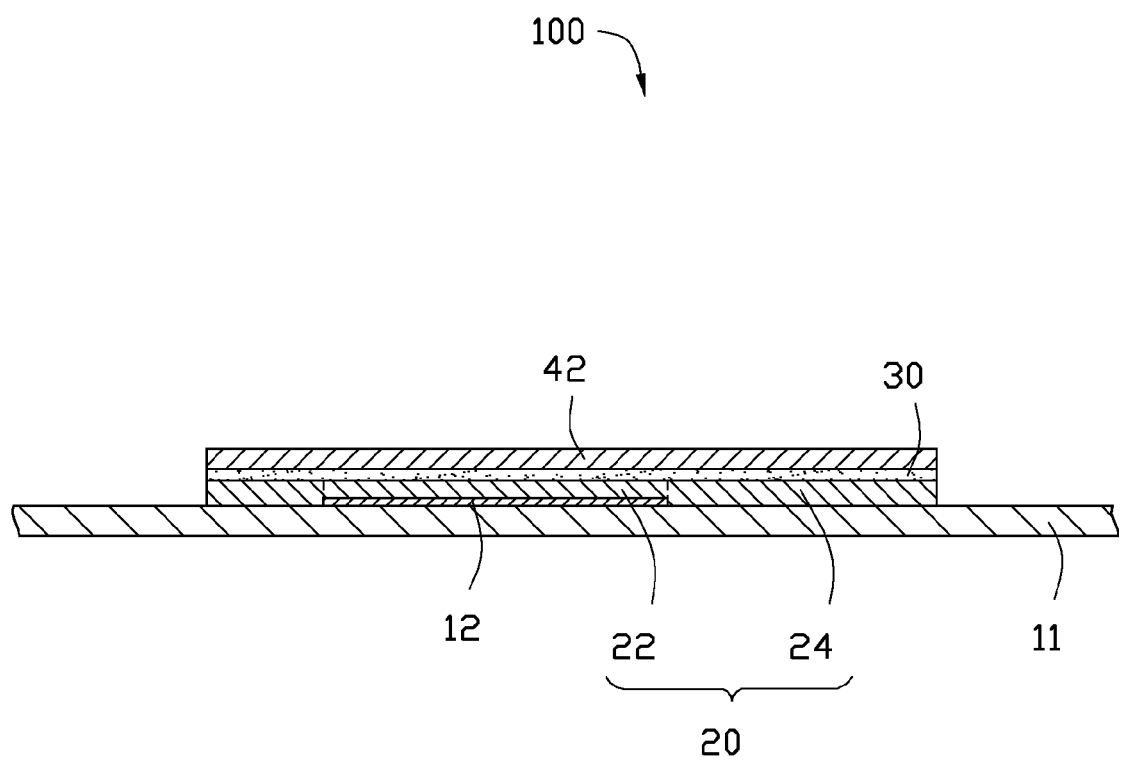
FIG. 3 is a sectional view of the chip package of FIG. 1, taken along line III-III thereof.

Referring to FIGS. 1-3, a chip package 100, according to a first exemplary embodiment, includes a circuit board 10, a pad 20 formed on the circuit board 10, an adhesive layer 30 adhered to the pad 20, and a chip 40.

The circuit board 10 includes a substrate 11 and a circuit layer 12 formed on the substrate 11. The circuit layer 12 is formed on the substrate 11 by copper traces or wires. The circuit layer 12 has a number of circuits configured for driving and/or controlling the chip 40.

The pad 20 is formed on the circuit board 10 by soldering. In particular, the pad 20 includes an electrical connection area 22 and an extending area 24. The electrical connection area 22 is positioned in a center portion of the pad 20. The extending area 24 extends out beyond the electrical connection area 22 but is entirely within the confines of the substrate 11. The pad 20 defines a blind hole 26 corresponding to the electrical connection area 22. When the pad 20 is formed on the circuit board 10, the extending area 24 abuts the substrate 11, and the circuit layer 12 is received in the blind hole 26 and abuts the electrical connection area 22. Thus the electrical connection area 22 directly covers the circuit layer 12, and the extending area 24 surrounds the electrical connection area 22 and the circuit layer 12. In addition, the electrical connection area 22 is electrically connected to the circuit layer 12. In this embodiment, the electrical connection area 22 is electrically connected to the circuit layer 12 by wires (not shown). In another embodiment, the electrical connection area 22 is made of conductive metal, such as copper, nickel, gold or silver, such that the electrical connection area 22 is electrically connected to the circuit layer 12.

The chip 40 is used in an optical coupling connector. In this embodiment, the chip 40 includes two chip areas 44 and an enlarging area 42. The enlarging area 42 defines two through holes 46 corresponding to the two chip areas 44. The two through holes 46 are apart from each other. The two chip areas 44 are received in the respective through holes 46, and thus the chip areas 44 are apart from each other. An upper surface 442 of each of the chip areas 44 is coplanar with a top surface 422 of the enlarging area 42, and a lower surface 444 of each of the chip areas 44 is coplanar with a bottom surface 424 of the enlarging area 42. Each chip area 44 includes a light emitting unit or a light receiving unit. The light emitting unit may be a laser diode. The light receiving unit may be a photo diode. In this embodiment, one of the chip areas 44 is a laser diode, the other one of chip areas 44 is a photo diode, and the dimensions of each of the chip areas 44 are about 200×200 microns. The chip areas 44 are electrically connected to the electrical connection area 22, so that the chip areas 44 are electrically connected to the circuit layer 12. The enlarging area 42 surrounds the two chip areas 44. The material of the enlarging area 42 may be rubber, plastic, resin, or the like.

The chip 40 adheres to the pad 20 through the adhesive, layer 30. In this embodiment, the adhesive layer 30 may be a glue layer. The width and the length of the pad 20 are equal to those of the chip 40.

During the manufacture of the chip package 100, the dimensions of the chip 40 may increase as the enlarging area 42 is increased, and the dimensions of the pad 20 becomes larger accordingly, such that the amount of the adhesive layer 30 (glue) is easily controlled, thereby easily fixedly attaching the chip 40 at a proper location on the pad 20 and avoiding any floating or shifting of the chip 40 as a result of overflowing glue.

Figure 4:
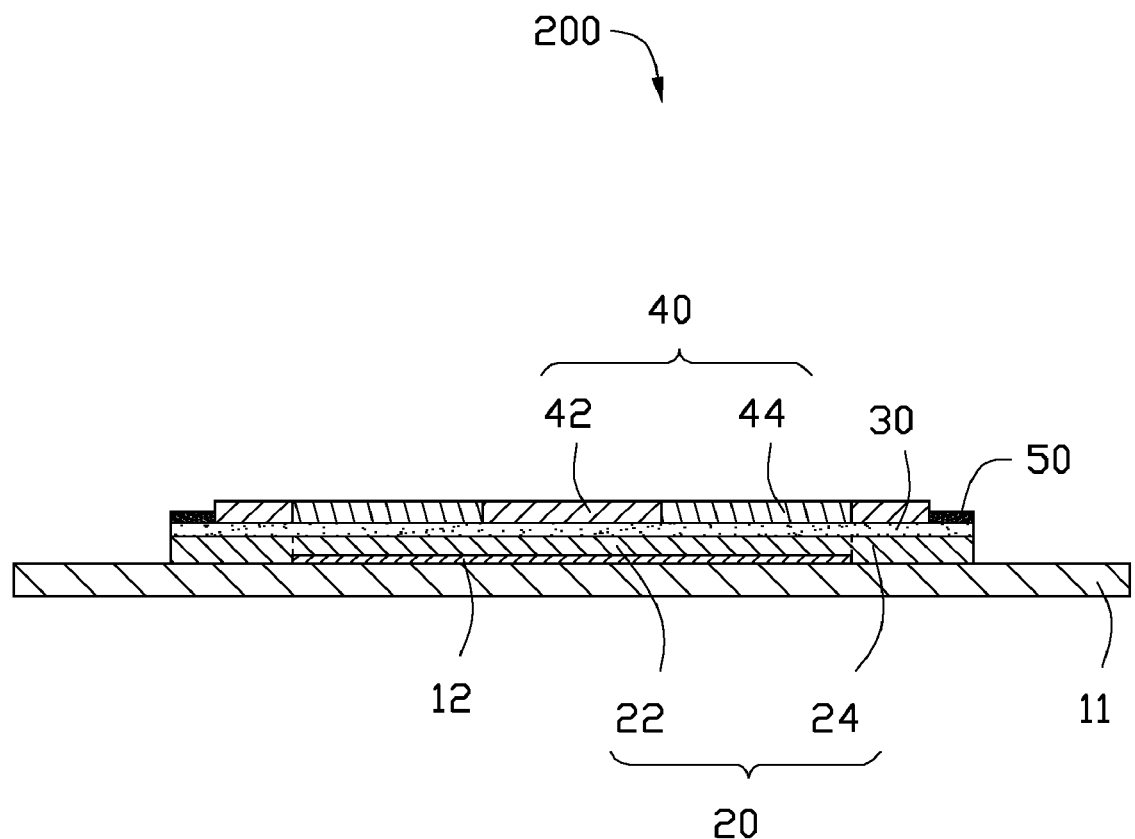
FIG. 4 is a sectional view of a chip package, according to a second exemplary embodiment.

Referring to FIG. 4, a chip package 200, according to a second exemplary embodiment, is shown. The differences between the chip package 200 of this embodiment and the chip package 100 of the first embodiment are: the width and the length of the chip 40 are less than those of the pad 20. A sealing compound 50 is positioned on the adhesive layer 30 and surrounds the chip 40, thereby the chip 40 is further attached to a correct and proper location on the pad 20.

Although numerous characteristics and advantages of the present embodiments have been set forth in the foregoing description, together with details of the structures and functions of the embodiments, the disclosure is illustrative only, and changes may be made in detail, especially in the matters of shape, size, and arrangement of parts within the principles of the disclosure to the full extent indicated by the broad general meaning of the terms in which the appended claims are expressed.

What is claimed is:

1. A chip package comprising:
   a circuit board comprising a substrate and a circuit layer positioned on the substrate;
   a pad comprising an electrical connection area in a center portion thereof and an extending area extending outward from the electrical connection area, the electrical connection area covering the circuit layer and electrically connected to the circuit layer, the extending area surrounding the electrical connection area and the circuit layer;
   a chip comprising two chip areas and an enlarging area having a top surface and a bottom surface at opposite major sides thereof, the enlarging area defining two through holes apart from each other, each chip area having an upper surface and a lower surface at opposite major sides thereof, the chip areas received in the respective through holes and electrically connected to the electrical connection area, the upper surface of each of the chip areas being coplanar with the top surface, and the lower surface of each of the chip areas being coplanar with the bottom surface; and a glue layer adhering the chip to the pad, the chip and the pad positioned on opposite sides of the glue layer.

2. The chip package of claim 1, wherein the electrical connection area is made of conductive metal selected from the group consisting of copper, nickel, gold and silver.

3. The chip package of claim 1, wherein each chip area comprises a light emitting unit or a light receiving unit.

4. The chip package of claim 3, wherein the light emitting unit is a laser diode, and the light receiving unit is a photo diode.

5. The chip package of claim 1, wherein the enlarging area is made of a material selected from the group consisting of rubber, plastic and resin.

6. The chip package of claim 1, wherein the width and the length of the pad are equal to those of the chip, and the center of the chip is aligned with that of the pad.

7. The chip package of claim 1, wherein the width and the length of the chip are less than those of the pad.

8. The chip package of claim 7, further comprising a sealing compound, wherein the sealing compound is positioned on the glue layer and surrounds the chip.

9. The chip package of claim 6, wherein the pad defines a blind hole corresponding to the electrical connection area, the extending area abuts the substrate, and the circuit layer is received in the blind hole and abuts the electrical connection area.

10. The chip package of claim 9, wherein the width and the length of the pad are equal to those of the glue layer.

11. The chip package of claim 10, wherein the pad abuts the glue layer, and the chip abuts the glue layer.

12. The chip package of claim 11, wherein the pad is formed on the circuit board by soldering.

13. The chip package of claim 11, wherein the electrical connection area is electrically connected to the circuit layer by wires.

* * * * *